(12) United States Patent
Mikami et al.

(10) Patent No.: US 7,196,961 B2
(45) Date of Patent: Mar. 27, 2007

(54) MEMORY CONTROL DEVICE

(75) Inventors: Takuya Mikami, Moriguchi (JP); Masayuki Toyama, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 85 days.

(21) Appl. No.: 11/194,935

(22) Filed: Aug. 2, 2005

(65) Prior Publication Data
US 2006/0028880 A1 Feb. 9, 2006

(30) Foreign Application Priority Data
Aug. 4, 2004 (JP) ............................. 2004-227928

(51) Int. Cl.
*G11C 8/00* (2006.01)
(52) U.S. Cl. ................... 365/230.03; 365/226
(58) Field of Classification Search .......... 365/230.03, 365/226, 222, 230.08
See application file for complete search history.

(56) References Cited

U.S. PATENT DOCUMENTS

| 5,307,320 A | * | 4/1994 | Farrer et al. ........... 365/230.01 |
| 5,619,471 A | * | 4/1997 | Nunziata ............... 365/230.03 |
| 5,761,695 A | | 6/1998 | Maeda et al. |
| 5,881,016 A | * | 3/1999 | Kenkare et al. ....... 365/230.03 |
| 6,674,684 B1 | * | 1/2004 | Shen ..................... 365/230.03 |

FOREIGN PATENT DOCUMENTS

JP 9-81453 3/1997

* cited by examiner

*Primary Examiner*—Anh Phung

(57) ABSTRACT

A memory control device controls data accesses to a memory which is composed of multiple banks and is switched between a normal mode for refreshing all banks and a power-saving mode for refreshing a bank. The memory control device includes: a setting information storage unit for storing a boundary address between memory areas to be and not to be refreshed in the power-saving mode; type information storage unit for receiving, from a CPU, and temporarily storing data information indicating whether data will be used in the power-saving mode; and an address converting unit for receiving a data access request from the CPU and converting, with reference to the boundary address, the address of requested data to an address inside or outside the refresh area depending of whether the data information indicates the data will or will not be used in the power-saving mode.

7 Claims, 8 Drawing Sheets

MEMORY CONTROL DEVICE

This application is based on an application No. 2004-227928 filed in Japan, the content of which is hereby incorporated by reference.

BACKGROUND OF THE INVENTION (1) Field of the Invention

The present invention relates to a memory control device. More particularly, the present invention relates to a technique for controlling read and write accesses to a memory that is switched, on a predetermined condition, between a mode of refreshing the entire memory area and a mode of refreshing part of the memory area.

(2) Description of the Related Art

Conventionally, DRAM and SDRAM are the types of memory normally used as main memory (hereinafter, simply "memory") of a personal computer and the like. Memory stores various programs run by the CPU as well as image data, audio data, and other data.

Memory is composed of multiple banks, so that data such as image data can be stored in the banks by memory interleaving, and thus processed at a high speed (see JP Patent Application Publication No. 08-055060).

Generally, memory holds data based on a charge on each of a plurality of capacitors, and the charge tends to decay over time. For the purpose of retaining data stored, a memory controller periodically refreshes the memory by writing the same data back.

Recently, a type of memory called "Mobile SDRAM" is increasingly adopted in mobile devices. Mobile SDRAM can be switched between a normal mode in which all banks are entirely refreshed and a power-saving mode in which a specific bank is refreshed either entirely or partly.

For example, a mobile device having mobile SDRAM operates in the normal mode when a power is supplied from an external source. On the other hand, when a power is supplied from an internal battery, the mobile device operates in the power-saving mode to save a refresh current (See Japanese Patent Application Publication No. 2002-334576).

It should be noted, however, some data stored in the normal mode may be located in a memory area that is not subjected to refreshing in the power-saving mode (hereinafter, a memory area that is subjected to refreshing in the power-saving mode is referred to as a "refresh area", whereas the other memory area is referred to as a "non-refresh area"). In order to continually use such data (including programs) in the power-saving mode, it is necessary to specify data that will be continually used and to transfer the specified data from a non-refresh area where the data is originally located to a refresh area. Alternatively, it is necessary to re-read the same data from an external recording medium into a refresh area.

With this being the situation, until data to be continually used is written to a refresh area, the CPU cannot access the data, which leads to a problem in smooth and continual use of the data.

SUMMARY OF THE INVENTION

In view of the above problems, the present invention aims to provide a memory control device which allows continual use of data without delay, when a normal mode is switched to a power-saving mode.

In order to achieve the above aim, the present invention provides a memory control device for controlling accesses to a memory and switching, on a predetermined condition, between a first mode in which an entire area of the memory is refreshed and a second mode in which a specific area of the memory is refreshed. The memory control device includes: a storage unit operable to store area information indicating the specific area; a receiving unit operable to receive, upon receipt of an access request, an address of data requested by the access request and data information indicating whether the requested data is first type data to be stored in the specific area or second type data other than the first type data; a converting unit operable to convert, with reference to the area information, the received address to an address of a location within the specific area if the data information indicates the first type data, and to an address of a location outside the specific area if the data information indicates the second type data; and an accessing unit operable to output the converted address to the memory and make an access according to the access request.

In another aspect, the present invention provides a computer system composed of the memory and the memory control device as sated above. The computer system includes: a receiving unit operable to receive an instruction for switching between the first and second modes; a mode-switching control unit operable to switch the memory between the first and second modes according to the instruction received by the receiving unit; and an access requesting unit operable to judge whether requested data is the first type data or the second type data and to issue to the memory control device an access request including an address of the data and data information indicating a result of the judgment.

With the structures stated above, when a data access request is received, data information indicating whether the requested data is first type data or second type data is also received. In accordance with the data information, a data read or write access is made to an address inside or outside the specific area.

Consequently, when the first type data is a resident program, for example, the resident program is stored at a memory address within the specific area which is subjected to refreshing. Thus, even when the first mode is switched to the second mode, the program is available for continual use without requiring data transfer to the specific area.

Furthermore, the memory may be composed of a plurality of banks. The specific area may be specific one or more of the banks. If the data information indicates the second type data, the converting unit may convert the received address, so that the access is made to the banks other than the specific bank by memory interleaving.

Alternatively, the memory may be composed of a plurality of banks. The specific area may be part of a specific one of the banks. If the data information indicates the second type data, the converting unit may convert the received address, so that the access is made to a remaining area of the specific bank and the banks other than the specific bank by memory interleaving.

With the structures stated above, multiple banks other than the specific bank are interleaved, and the second type data is stored in the interleaved banks. This arrangement allows the second type data to be processed at a high speed when the second type data is large volume image data.

Furthermore, the second type data may be image data satisfying a predetermined condition. The first type data may be data other than the image data.

With the structure stated above, image data no smaller than a predetermined size is determined as second type data, while any other data is determined as first type data. With this arrangement, no large-sized image data is processed in the power-saving mode, while allowing small-sized image data and programs to be processed.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

<Embodiment>

Hereinafter, a description is given to a computer system including a memory control device by way of one embodiment of the present invention.

<Overview>

FIG. 6 show memory according to the present embodiment.

The memory 400 has a memory area composed of banks B0, B1, B2, and B3 in the stated order from the top of the memory. In the figures, the banks B0, B1, B2 and B3 are represented by rectangles 410, 420, 430, and 440, respectively. The banks are accessible by memory interleaving.

Furthermore, the memory 400 can be switched between normal and power-saving modes for a refreshing operation. In the normal mode, all of the banks are entirely refreshed. In the power-saving mode, on the other hand, a particular one or more of the banks are refreshed either entirely or partly.

Figure 6A:
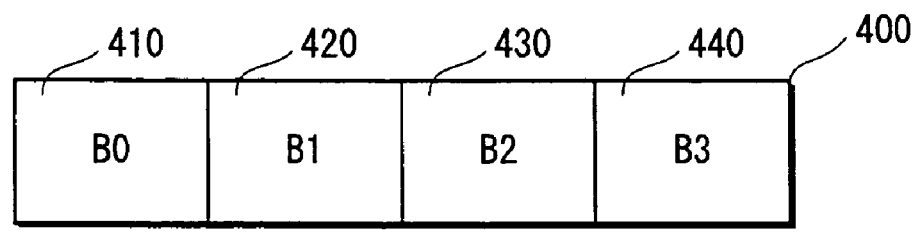
FIG. 6A shows memory according to the embodiment and a modification of the present invention.
Figure 6B:
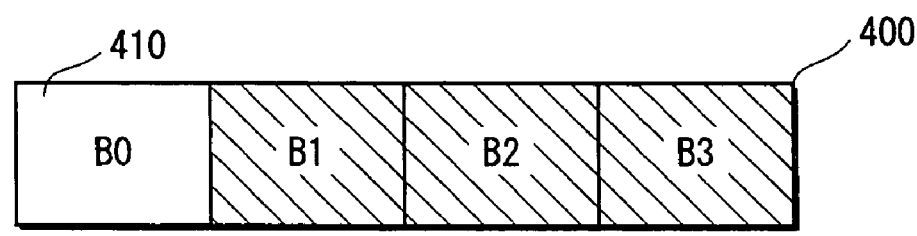
FIG. 6B shows the memory in a power-saving mode according to the embodiment.
Figure 6C:
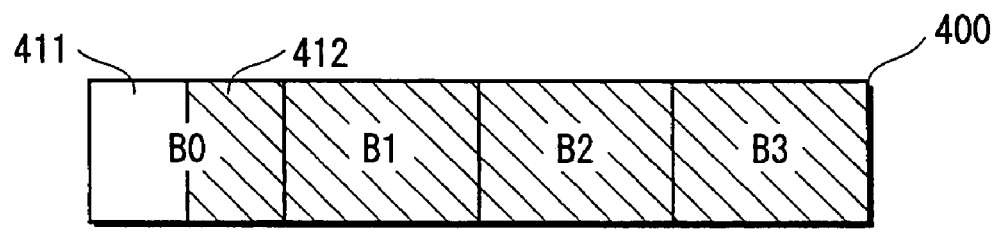
FIG. 6C shows the memory in a power-saving mode according to the modification.

FIG. 6A shows the state of memory banks in the normal mode, whereas FIGS. 6B and 6C show the states of memory banks in the power-saving mode. In the figures, the shads represent the memory areas that are not refreshed in the power-saving mode. FIG. 6C indicates that only part of the bank B0 represented by a rectangle 411 is refreshed.

In the power-saving mode according to present embodiment, it is assumed that the entire bank B0 is refreshed as shown in FIG. 6B.

A memory controller according to the present invention executes an application, thereby receiving data type information from a CPU together with a data access request. The data type information indicates whether the requested data will be used in the power-saving mode.

When data type information received with an access request indicates that the requested data will be used in the power-saving mode, the memory controller allocates free pages available in the bank B0. On the other hand, when the data type information indicates that the requested data will not be used in the power-saving mode, the memory controller allocates free pages available in the respective banks B1–B3, so as to allow the data to be accessed by memory interleaving. The memory controller then converts the logical address of the requested data to a physical address.

In the normal mode according to the present embodiment, the memory controller accesses the bank B0 as a non-interleaved area and the banks B1–B3 as interleaved areas.

<Configuration>

Figure 1:
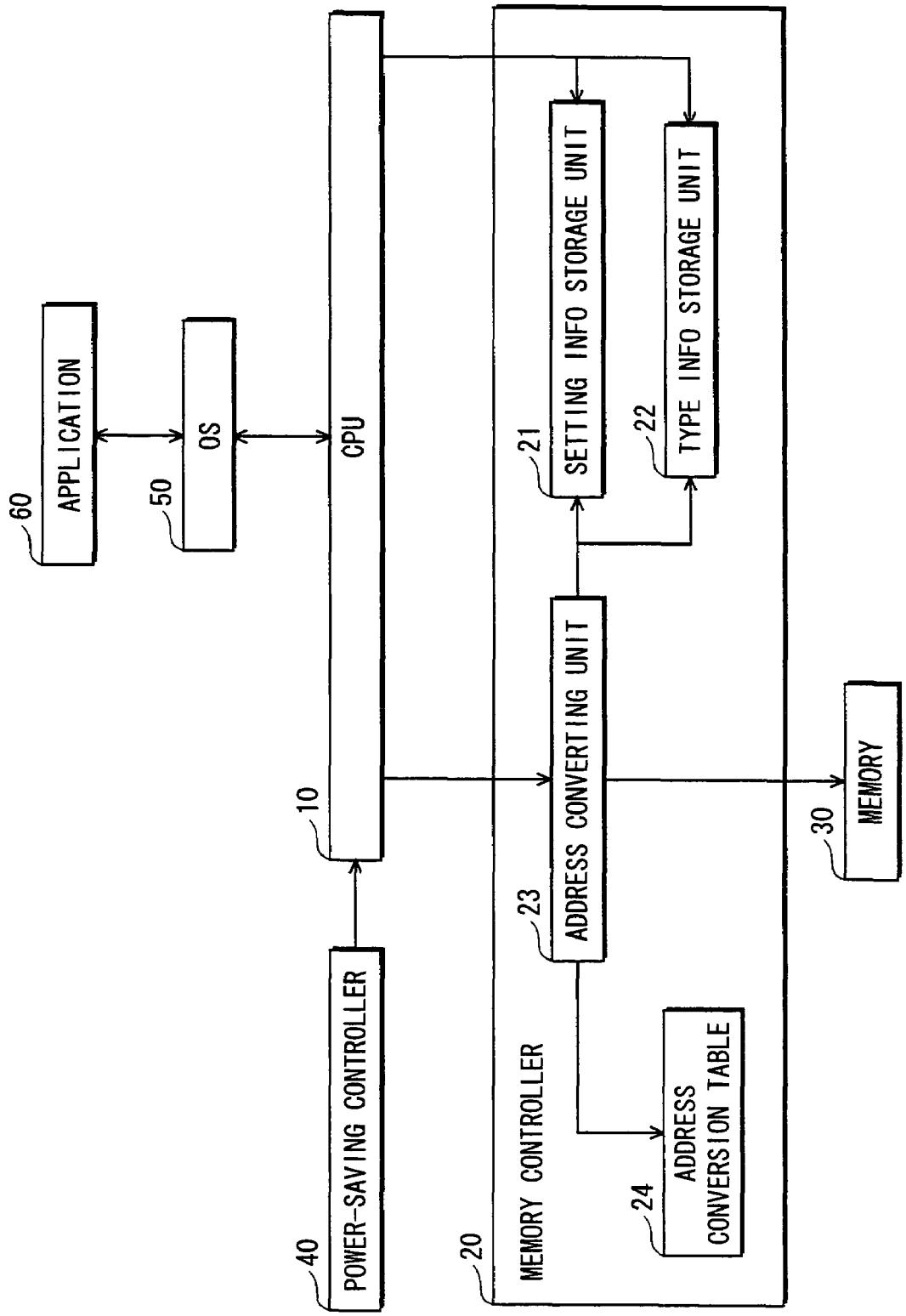
FIG. 1 shows the system configuration of a computer system according to an embodiment of a present invention.

FIG. 1 shows the system configuration of a computer system according to the present embodiment. Hereinafter, a description is given to its components one by one.

(OS 50)

An OS 50 is loaded by a loader into the bank B0, which is a refresh area. In addition, it is always the bank B0 that is allocated for data and an application used by the OS 50, as well as for data areas such as a heap area and a stack area that are normally allocated for the application.

In response to a memory allocation request from an application 60, the OS 50 allocates pages in a logical space, and stores a page management table into a specific register within the CPU. The page management table is used to manage pages allocated in response to a memory allocation request attached with a power-saving flag.

(Application 60)

The application 60 is an application program stored in an external storage medium such as a hard disk, and is executed by the CPU 10 under the control of the OS 50.

During its execution, the application 60 issues a memory allocation request to the OS 50. If a data file read from an external recording medium and to be stored in an allocated memory area has an extension indicating image data such as JPEG data and the size corresponds to, for example, one or more pages, the application 60 determines that the data file will not be used in the power-saving mode. Accordingly, the application 60 issues for the data file a memory allocation request attached with a power saving flag, and receives allocation of pages from the OS 50.

(CPU 10)

The CPU 10 executes control programs such as OSes stored in ROM and the bank B0. The CPU 10 also executes the application 60 stored in the external storage medium.

Further, the CPU 10 functions to: receive a data access request relating to a data transfer to the memory, involved in execution of STR and LD instructions; set the type of requested data, with reference to the logical address of the requested data and the page management table 200; and send the set data type and the data access request to the memory controller 20.

Still further, the CPU 10 functions to send setting information to the memory controller 20. The setting information is user-set information indicating which of the banks are set to be refreshed in the power-saving mode and which of the banks are interleaved. The CPU 10 also functions to receive, from a power-saving controller 40, mode information indicating either of the normal and power-saving modes, and send the mode information to a memory 30 (i.e., the memory 400).

(Memory Controller 20)

The memory controller 20 is composed of a setting information storage unit 21, a type information storage unit 22, an address converting unit 23, and an address conversion table 24.

The setting information storage unit 21 functions to receive, from the CPU 10, and store setting information. Details of the setting information will be given later.

The type information storage unit 22 functions to store data type information attached to a data access request received from the CPU 10.

The address converting unit 23 functions to search for free pages in either of the non-interleaved and interleaved areas, based on the setting information and the data type information. The address converting unit 23 then allocates as many free pages as necessary to store the requested data, and converts a logical address of the requested data to a physical address. The address converting unit 23 also functions to store the requested data at the thus converted physical address.

The address conversion table 24 functions to store a logical address of data requested by a data access request issued from the CPU 10, in association with a physical address in the memory 30 mapped to the logical address. The address conversion table 24 is read out and updated by the address converting unit 23.

(Memory 30)

The memory 30 functions to store the data requested by a data access request that is issued from the CPU 10, at the address allocated by the memory controller 20.

(Power-Saving Controller 40)

The power-saving controller 40 functions to switch, in response to a user operation, the normal mode to the power-saving mode and vice versa, and to send mode information to the CPU 10.

<Data>

FIG. 2 show various pieces of data stored in the CPU 10 and the memory controller 20. Hereinafter, a description is given one by one to the pieces of data.

Figure 2A:
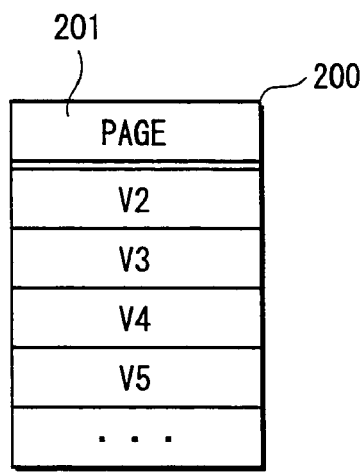
FIG. 2 show the structures of tables used by a CPU and a memory controller shown in FIG. 1, along with examples of data contents.

FIG. 2A shows the structure of the page management table 200 stored within the CPU 10, along with an example of the data contents.

The page management table 200 is composed of a page column 201 showing pages in the logical space. The page management table 200 is updated by the OS 50.

Figure 2B:
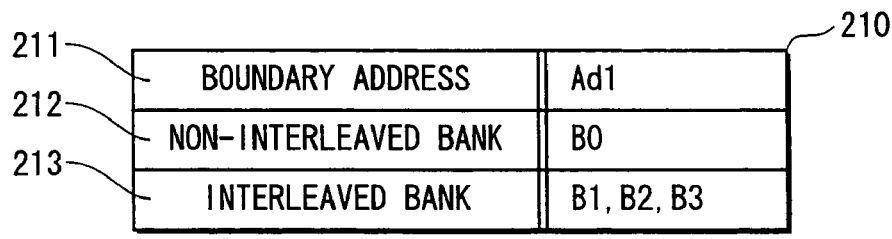

FIG. 2B shows the setting information 210 composed of a boundary address 211 and interleave information. The interleave information is in turn composed of a non-interleaved bank 212 and an interleaved bank 213.

The boundary address 211 locates a boundary between the banks to be refreshed and not to be refreshed in the power-saving mode.

The non-interleaved bank 212 indicates banks located in the non-interleaved area, whereas the interleaved bank 213 indicates banks in the order in which the banks are accessed by memory interleaving.

Note that the interleave information depends on the boundary address, and thus changes if the boundary address changes.

The setting information 210 is set by a user and stored by the CPU 10 into the setting information storage unit 21.

Figure 2C:
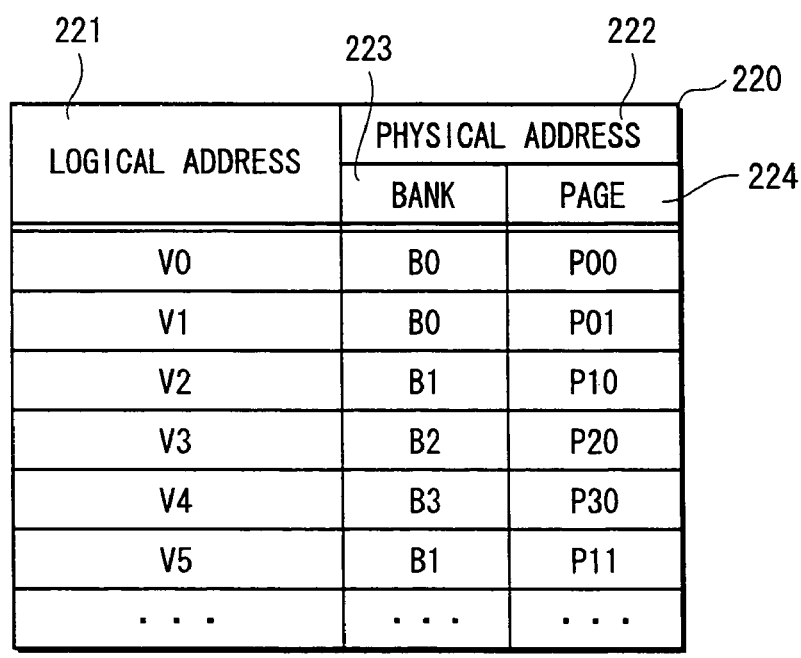

FIG. 2C shows the structure of the address conversion table 220, along with an example of the data contents.

The address conversion table 220 stores a logical address 221, in association with a physical address 222 mapped to the logical address. The physical address is composed of a bank number 223 and a page number 224.

The logical address 221 is the address of a page in the logical space.

The physical address 222 is the address of a physical page on the memory 30. The bank number 223 specifies one of the banks constituting the memory 30 and the page number 224 specifies a page in the physical space.

The address conversion table 220 is read out and updated by the address converting unit 23.

<Operation>

Now, a description is given to operation of the OS 50 and the CPU 10 according to the present embodiment described above.

Figure 3:
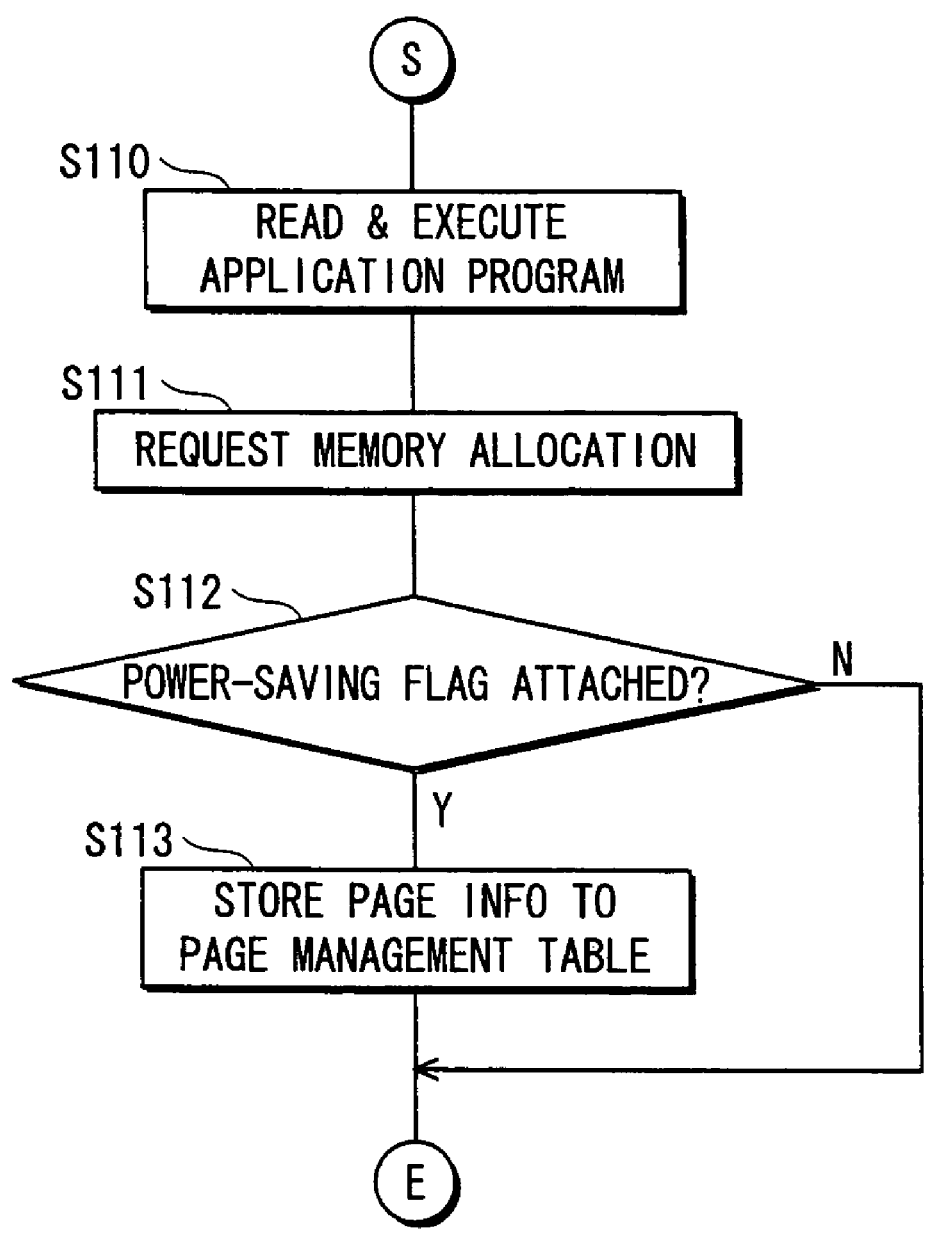
FIG. 3 is a flowchart of processing steps performed by an OS shown in FIG. 1.

FIG. 3 is a flowchart of processing steps performed by the OS 50, according to the present embodiment.

By the CPU 10 executing the application 60 via the OS 50 (step S110), the OS 50 receives from the application 60 a memory allocation request that includes information indicating a data size (step Sill).

Next, the OS 50 allocates as many pages as necessary to store data of the data size indicated by the memory allocation request, and judges whether the memory allocation request is attached with a power-saving flag (step S112).

In the step S112, if it is judged that a power-saving flag is attached (step S112: Y), the OS 50 causes the allocated pages to be stored in the page management table 200 (step S113).

Figure 4:
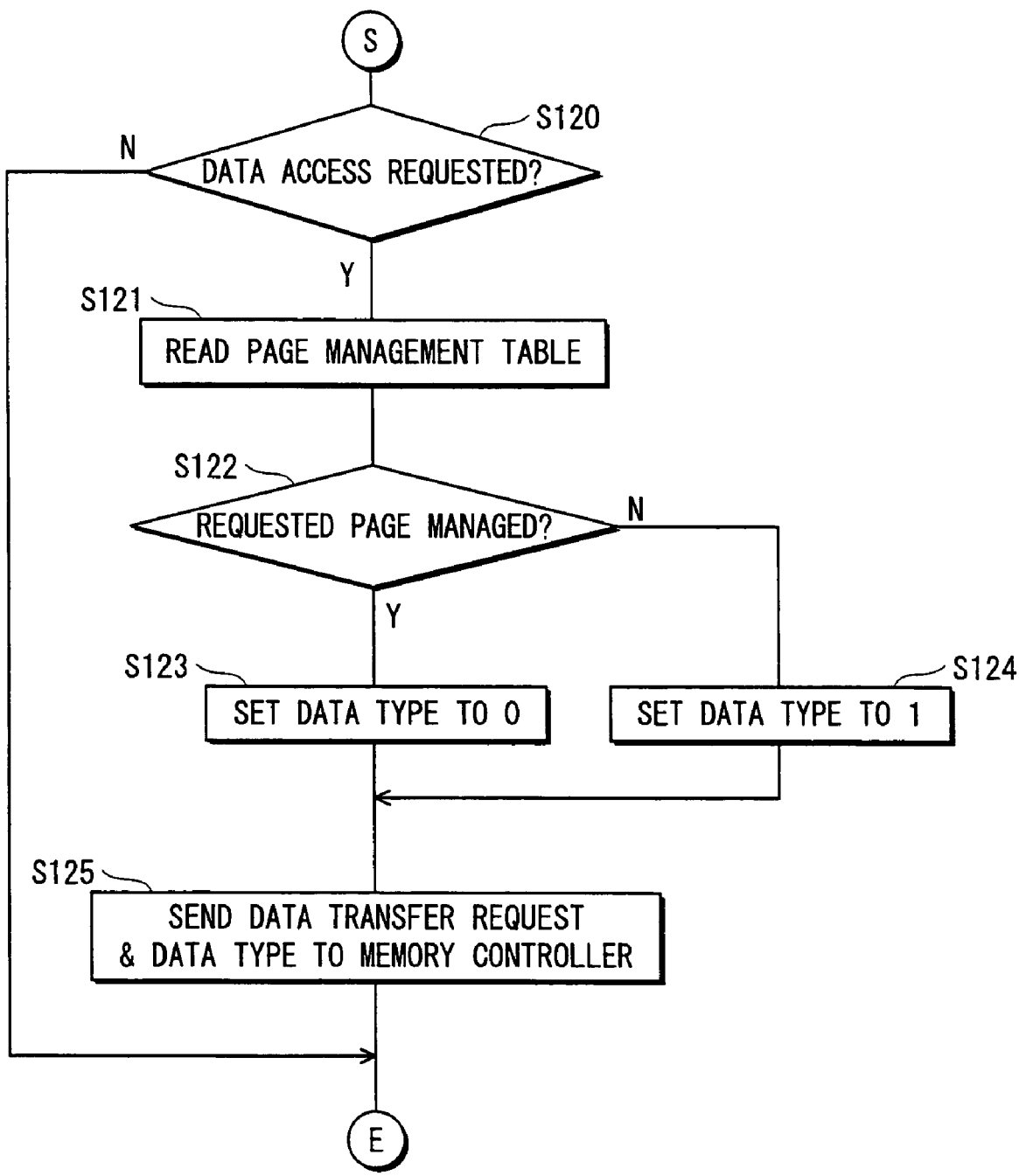
FIG. 4 is a flowchart of processing steps performed by the CPU.

FIG. 4 is a flowchart of processing steps performed by the CPU 10, according to the present embodiment.

Through the execution of the application 60, the CPU 10 receives a data access request that includes information specifying the pages in the logical space and the data size (step S120: Y). Upon receipt, the CPU 10 reads the page management table 200 (step S121).

Next, if it is judged that the pages requested by the data access request are stored in the page management table 200 (step S122: Y), the CPU 10 sets the data type to "0" (step S123). On the other hand, if it is judged that the pages are not stored in the page management table 200 (step S122: N), the CPU 10 sets the data type to "1" (step S124).

Finally, the CPU 10 sends to the memory controller 20 the data access request attached with the data type (step S125) Now, a description is given to operation steps performed by the memory controller 20 upon receipt of the above-described data access request from the CPU 10.

Figure 7A:
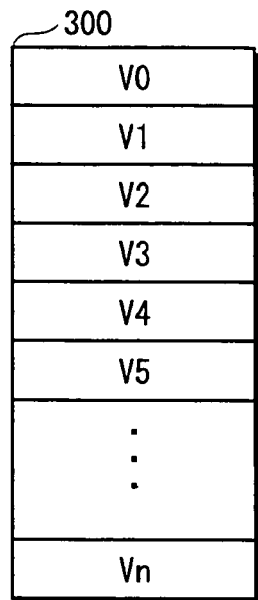
FIG. 7 show memory allocation according to the embodiment.
Figure 7B:
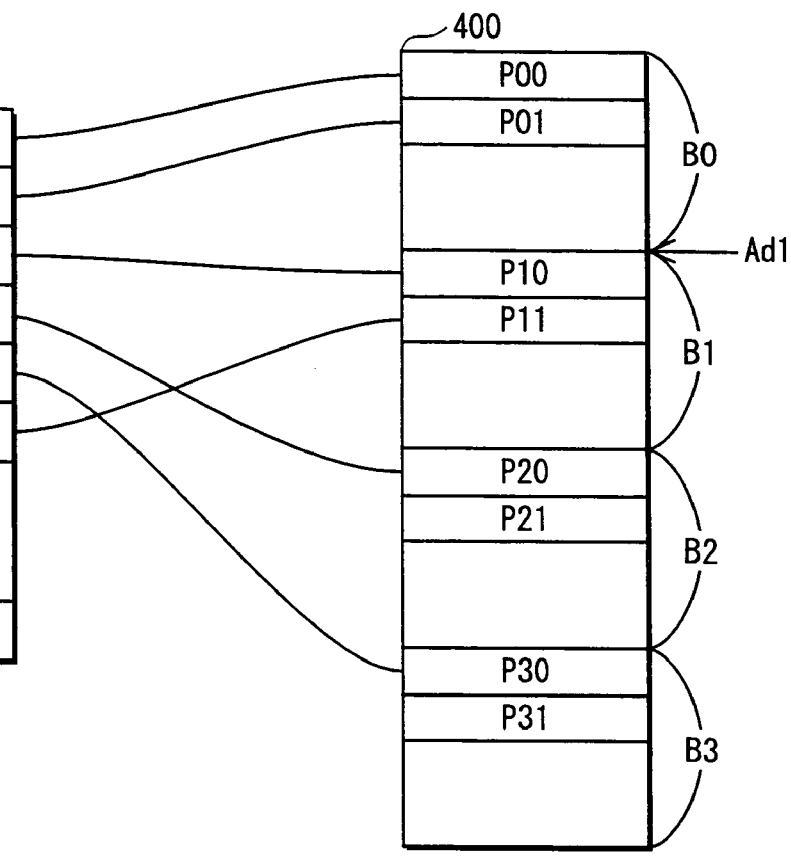
Figure 7C:
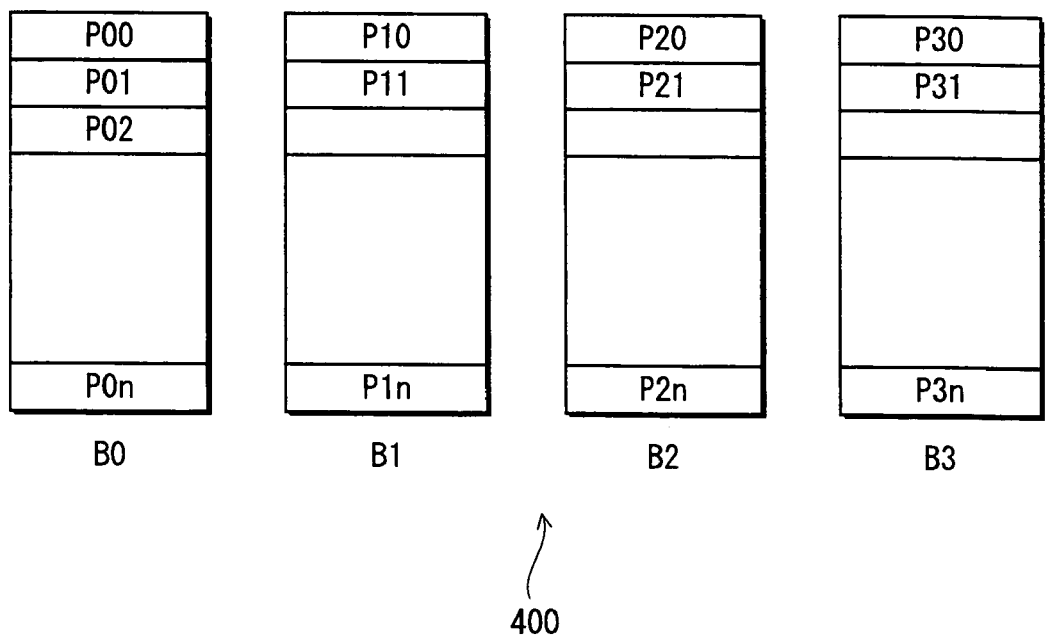

FIG. 7A shows the logical space 300 composed of pages having logical address $V_0$ to $V_n$. FIG. 7B shows the physical space (i.e. the memory) 400 mapped to the logical space 300. FIGS. 7A and 7B together show the mapping between logical pages and physical pages. FIG. 7C shows the physical space 400 separately for each bank.

Hereinafter, with reference to the flowchart shown in FIG. 5, a description is given to the processing steps performed by the memory controller 20, using the example shown in FIGS. 7 and 2.

Note that the pages $V_2$ to $V_5$ shown in FIG. 2A are the pages $V_2$ to $V_5$ in the logical space 300 illustrated in FIG. 7A, and that the setting information 210 shown in FIG. 2B is sent out in advance by the CPU 10 and stored in the setting information storage unit 21.

Now, a description is given assuming, as an example, that the address converting unit 23 receives from the CPU 10 a data access request that includes information indicating the logical page address $V_0$, the data size corresponding to two pages, and the data type "1".

Upon receipt of the above-mentioned data access request, the address converting unit 23 stores the data type "1" in the type information storage unit 22 (step S201), and reads the setting information 210 and the address conversion table 220 (step S202).

In addition, the address converting unit 23 calculates, from the data size indicated by the data access request, the number of pages in the memory 400 that needs to be allocated (step S203). In this case, it is calculated that the number of pages to be allocated is "2".

Next, the address converting unit 23 reads the data type information from the type information storage unit 22 and judges whether the read information indicates the data type "0" (step S204).

If it is judged in the step S204 that the data type is "1" (step S204: N), the address converting unit 23 searches for free pages available in the bank B0, which is the non-interleaved bank 212 (step S211).

As a result of the search, the address converting unit 23 specifies and allocates the free page P00, and successively allocates the free page P01. Each time a free page is allocated, the address conversion 23 counts up. When the count reaches the number of pages to be allocated, which in this case is "2", the allocation processing is terminated.

Next, the address converting unit 23 updates the address conversion table 220 by newly mapping the logical address $V_0$ to the page P00 and the logical address $V_1$ to the page P01 (step S212).

Now, a description is given using another example in which the address converting unit 23 receives from the CPU 10 a data access request that includes information indicating the logical page address $V_2$, the data size corresponding to four pages, and the data type "0".

Upon receipt of the above-mentioned data access request, the address converting unit 23 stores the data type "0" to the type information storage unit 22 (step S201), and reads the setting information 210 and the address conversion table 220 (step S202).

Next, the address conversion table 23 calculates, from the data size indicated by the data access request, the number of pages in the memory 400 that needs to be allocated (step S203). In this case, it is calculated that the number of pages to be allocated is "4". On judging that the data type is "0" (step S204: Y), the address converting unit 23 searches for free pages available in the bank B1, which is one of the interleaved banks (step S205).

As a result of the search, the address converting unit 23 specifies the free page P10 as the first page for memory interleaving (step S206). Starting from the page P10, the address converting unit 23 sequentially allocates free pages available in the interleaved banks B1, B2, and B3 in the stated order. Each time a free page is allocated, the address converting unit 23 counts up.

More specifically, after allocating the page P10, the address converting unit 23 sequentially allocates the page P20 (=P10+the number of pages per bank), and the page P30 (=P10+the number of pages per bank×2). The address converting unit 23 then updates the address conversion table 220 (as shown in FIG. 2C) by newly mapping the logical addresses $V_2$–$V_5$ to the physical addresses P10–P30 (step S207).

As a result of allocating the page 30, the count of allocated pages reaches the value of "3" (step S208: Y). Thus, the address converting unit 23 searches for and allocates the next free page P11 available in the bank B1, and updates the address conversion table 220 accordingly (step S209).

As a result of allocating the page P11, the count reaches the value of "4", which is equal to the number of pages to be allocated (step S210: Y). Thus, the address conversion processing is terminated.

According to the present embodiment, as long as the count value is not a multiple of "3" (step S208: N), the step S207 is repeated. In addition, as long as the count value is less than the number of pages to be allocated (step S210: N), the steps S207 and onward are repeated.

Further, when updating the address conversion table 220, the address converting unit 23 stores the data requested by the currently processed data access request into the memory location of the memory 30 specified by the physical address obtained as a result of the address conversion processing.

<Modification>

According to the above embodiment, the bank B0 is the only bank that is refreshed in the power-saving mode as shown in FIG. 6B. Yet, the present invention is applicable to a modified embodiment in which only a part of the bank B0 represented by the rectangle 411 is refreshed as shown in FIG. 6C.

Figure 8A:
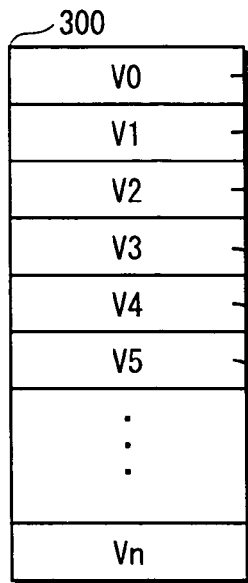
FIG. 8 show memory allocation according to the modification.
Figure 8B:
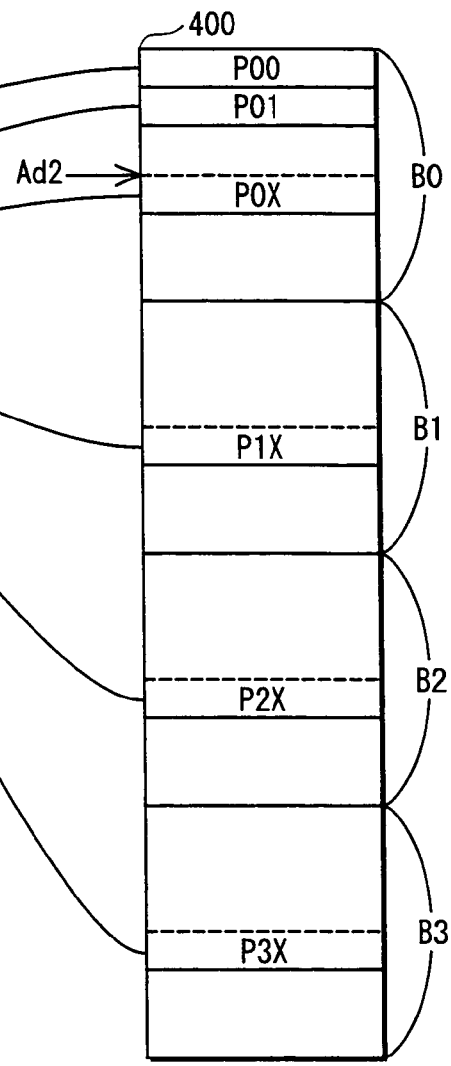

Similarly to the above embodiment, FIGS. 8A and 8B respectively show the logical space 300 and the physical space 400 of the memory 400. FIGS. 8A and 8B together show the mapping between the pages in the logical space 300 and the pages in the physical space 400.

Figure 8C:
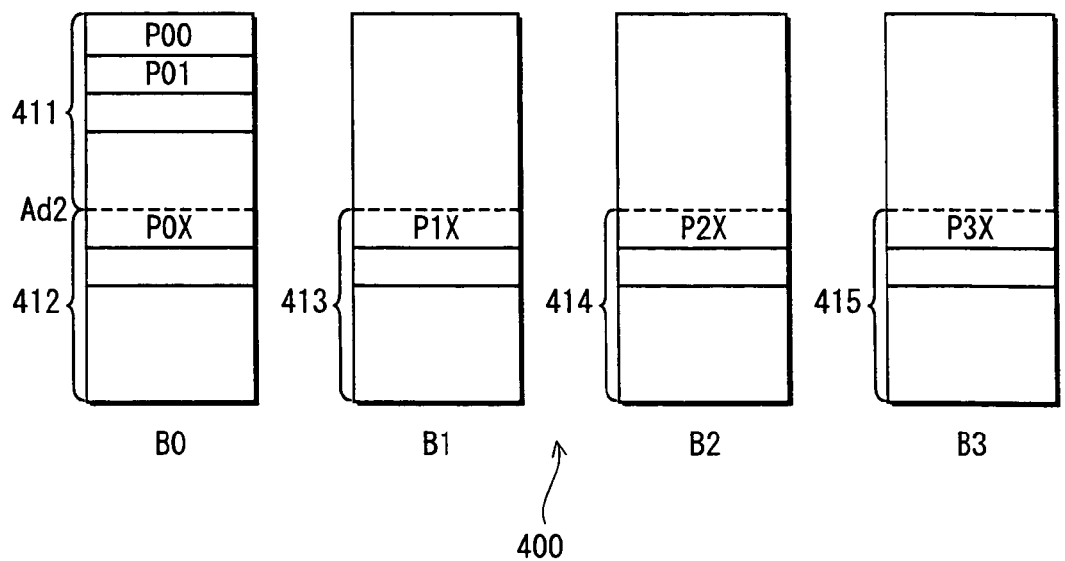

FIG. 8C shows the physical space 400 shown in FIG. 8B separately for each bank.

In the modification, the address Ad2 is the boundary address locating the boundary between areas 411 and 412 within the bank B0.

In the case where the data type is "0", free pages in the areas 412, 413, 414, and 415 all of which have larger addresses in the respective banks than the boundary address Ad2 are allocated, so as to allow the stored data to be accessed by memory interleaving. After the allocation, the logical addresses are converted to physical addresses of allocated pages and the data is stored in the allocated pages.

In the case where the data type is "1", on the other hand, free pages in the area 411 of the bank B0 are allocated. After the allocation, the logical addresses are converted to physical addresses of allocated pages and the data is stored in the allocated pages.

The setting information according to the modification is composed of information indicating the boundary address of "Ad2" and the interleaved banks of "B0, B1, B2, and B3". The setting information further includes first page information indicating the address of the first page in each interleaved bank, which in this example are "$P_{0X}$, $P_{1X}$ (=$P_{0X}$+the number of pages per bank), $P_{2X}$ (=$P_{0X}$+the number of pages per bank×2), and $P_{3X}$ (=$P_{0X}$+the number of pages per bank× 3)".

In this modification, in addition, none of the banks is set as interleaved banks. Rather, the last page in the refresh area of the bank B0 is set.

<Operation>

Figure 5:
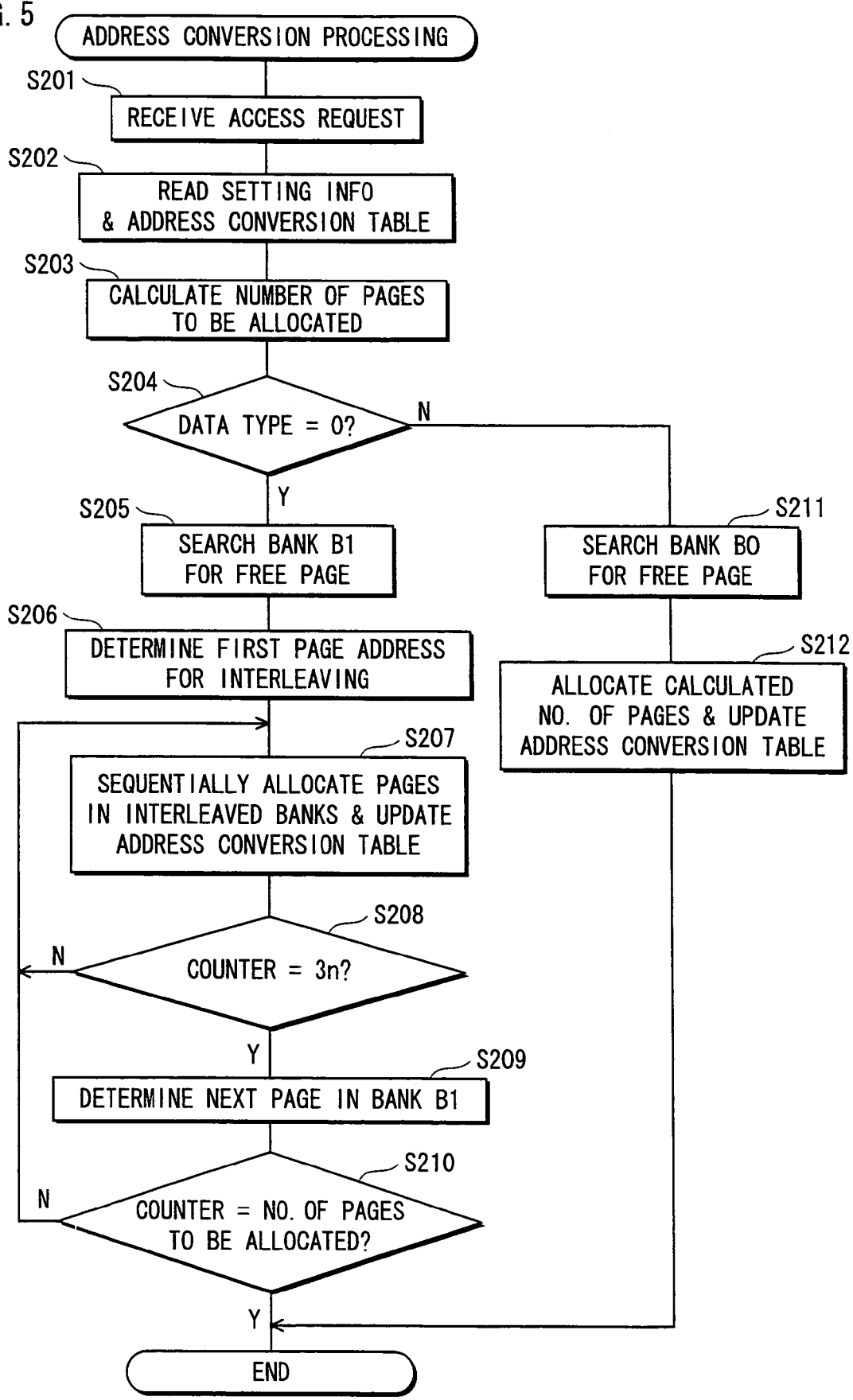
FIG. 5 is a flowchart of processing steps performed by the memory controller.

Now, a description is given with reference to FIGS. 5 and 8 to operation of the memory controller 20, according to the modification.

Similarly to the above embodiment, the pages $V_2$ to $V_5$ shown in FIG. 2A are the pages $V_2$ to $V_5$ in the logical space 300 shown in FIG. 8A.

In the case of receiving from the CPU 10 a data access request that includes information indicating the logical page address $V_0$, the data size corresponding to two pages, and the data type "1", the address converting unit 23 performs the step S201–S204 as follows.

On judging in the step S204 that the data type is "1" (step S204: N), the address converting unit 23 searches for free pages from pages of the bank B0 starting from the first page to the last page of the refresh area that is set in advance. (step S211).

The address converting unit 23 then sequentially allocates the free pages P00 and P01, and accordingly updates the address conversion table 220 in a similar manner to the above embodiment (step S212).

In the case of receiving from the CPU 10 a data access request that includes information indicating the logical page address $V_2$, the data size corresponding to four pages, and the data type "0", the address converting unit 23 performs the step S201–S204 as follows.

On judging in the step S204 that the data type is "0" (step S204: Y), the address converting unit 23 searches for free pages available in the bank B0 located at an address larger than the page $P_{0X}$, with reference to the setting information indicating the interleaved banks and the first page information indicating the first page in each interleaved bank (step S211).

In this modification, as a result of the search in the step S205, the page $P_{0X}$ is determined as the first page for memory interleaving. Thus, the address converting unit 23 sequentially allocates the pages $P_{0X}$, $P_{1X}$, $P_{2X}$, and $P_{3X}$ in the stated order, and accordingly updates the address conversion table (step S207).

Note that the number of interleaved banks in this modification is four. Thus, in the step S208, it is judged whether the counter value is equal to a multiple of "4". If the counter value is judged equal to a multiple of "4" (step S208: Y), a next free page in the bank B0 is searched (step S209)

<Supplemental Note>

Up to this point, the memory control device according to the present invention has been described using the above embodiment and modification. It should be naturally appreciated, however, that the present invention is not limited to the memory control device shown in the above specific embodiment and modification.

(1) According to the above embodiment and modification, the memory is composed of four banks. Yet, the present invention is also applicable to any memory as long as the memory consists of a plurality of banks and specific one or more of the banks are refreshed entirely or partly.

(2) According to the above embodiment and modification, in the power-saving mode, only the bank B0 is refreshed (FIG. 6B) or a half area of the bank B0 is refreshed (FIG. 6C). Yet, the present invention is applicable to the case where the banks B0 and B1 are refreshed.

In such a case, upon receipt of a data access request indicating the data type "0", the address converting unit 23 allocates free pages available in the respective banks B2 and B3, so as to allow access by memory interleaving. On the other hand, upon receipt of a data access request indicating the data type "1", the address converting unit 23 searches the bank B0 or B1 for free pages and allocates the thus searched free pages.

(3) According to the above embodiment and modification, all of the banks other than the banks to be refreshed are set to be interleaved. Yet, it is applicable only some of the non-refresh banks are determined to be interleaved.

(4) According to the above embodiment and modification, the page management table stores pages relating to memory allocation requests each attached with a power-saving flag. Yet, it is applicable that the page management table stores all pages relating to any memory allocation request. In this case, the page management table stores, for each page, information indicating whether the page will be used in the power-saving mode.

(5) According to the above embodiment and modification, the memory allocation is carried out in units of pages. Yet, it is applicable to carry out the memory alloation using a segmentation approach with which blocks of a variable size are allocated.

(6) A program for causing a processor to perform the address conversion processing performed in the above embodiment or modification by the memory control device may be distributed in form of a recording medium storing the program or via various communications line. Examples of such recording mediums include an IC card, hard disk, optical disc, flexible disk, and ROM. The program distributed is put to use by being stored in a memory or the like that is readable by a processor. By executing the program, the processor carries out the functions of the memory control device described in the above embodiment or modification.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A memory control device for controlling accesses to a memory and switching, on a predetermined condition, between a first mode in which an entire area of the memory is refreshed and a second mode in which a specific area of the memory is refreshed, the device comprising:
    a storage unit operable to store area information indicating the specific area;
    a receiving unit operable to receive, upon receipt of an access request, an address of data requested by the access request and data information indicating whether the requested data is first type data to be stored in the specific area or second type data other than the first type data;
    a converting unit operable to convert, with reference to the area information, the received address to an address of a location within the specific area if the data information indicates the first type data, and to an address of a location outside the specific area if the data information indicates the second type data; and
    an accessing unit operable to output the converted address to the memory and make an access according to the access request.

2. The memory control device according to claim 1, wherein the memory is composed of a plurality of banks,
    the specific area is specific one or more of the banks, and
    if the data information indicates the second type data, the converting unit converts the received address, so that the access is made to the banks other than the specific bank by memory interleaving.

3. The memory control device according to claim 1, wherein the memory is composed of a plurality of banks,
    the specific area is part of a specific one of the banks, and
    if the data information indicates the second type data, the converting unit converts the received address, so that the access is made to a remaining area of the specific bank and the banks other than the specific bank by memory interleaving.

4. The memory control device according to claim 1, wherein the second type data is image data satisfying a predetermined condition, and the first type data is data other than the image data.

5. A computer system composed of the memory and the memory control device as defined in claim 1, the system comprising:

a receiving unit operable to receive an instruction for switching between the first and second modes;

a mode-switching control unit operable to switch the memory between the first and second modes according to the instruction received by the receiving unit; and an access requesting unit operable to judge whether requested data is the first type data or the second type data and to issue to the memory control device an access request including an address of the data and data information indicating a result of the judgment.

6. A control method for controlling accesses to a memory, and switching, on a predetermined condition, between a first mode in which an entire area of the memory is refreshed and a second mode in which a specific area of the memory is refreshed, the method comprising:

storing area information indicating the specific area;

receiving, upon receipt of an access request, an address of data requested by the access request and data information indicating whether the requested data is first type data to be stored in the specific area or second type data other than the first type data;

converting, with reference to the area information, the received address to an address of a location within the specific area if the data information indicates the first type data, and to an address of a location outside the specific area if the data information indicates the second type data; and outputting the converted address to the memory and making an access according to the access request.

7. A control program for causing a device executing the program to control accesses to a memory and to switch, on a predetermined condition, between a first mode in which an entire area of the memory is refreshed and a second mode in which a specific area of the memory is refreshed, the program comprising code operable to cause the device to:

store area information indicating the specific area;

receive, upon receipt of an access request, an address of data requested by the access request and data information indicating whether the requested data is first type data to be stored in the specific area or second type data other than the first type data;

convert, with reference to the area information, the received address to an address of a location within the specific area if the data information indicates the first type data, and to an address of a location outside the specific area if the data information indicates the second type data; and output the converted address to the memory and make an access according to the access request.

* * * * *